(12) United States Patent
Chen et al.

(10) Patent No.: US 7,629,275 B2
(45) Date of Patent: Dec. 8, 2009

(54) MULTIPLE-TIME FLASH ANNEAL PROCESS

(75) Inventors: Jennifer Chen, Hsin-Chu (TW); Chi-Chun Chen, Kaohsiung (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 183 days.

(21) Appl. No.: 11/698,239

(22) Filed: Jan. 25, 2007

(65) Prior Publication Data
US 2008/0182430 A1 Jul. 31, 2008

(51) Int. Cl.
*H01L 21/00* (2006.01)
(52) U.S. Cl. .............. 438/799; 438/535; 438/530; 257/E21.473; 257/E21.454
(58) Field of Classification Search .......... 438/798, 438/799, 513, 535, 796, 540, 530; 257/E21.475, 257/E21.471, E21.497, E21.47, E21.454, 257/E21.473
See application file for complete search history.

(56) References Cited

U.S. PATENT DOCUMENTS

| | | | | |
|---|---|---|---|---|
| 6,376,806 B2 * | 4/2002 | Yoo | ............... | 219/411 |
| 6,660,605 B1 * | 12/2003 | Liu | ............... | 438/307 |
| 6,770,519 B2 | 8/2004 | Ito et al. | | |
| 7,279,405 B2 * | 10/2007 | Itani et al. | ......... | 438/530 |
| 2005/0003621 A1 * | 1/2005 | Nakaoka et al. | ......... | 438/301 |
| 2006/0088969 A1 * | 4/2006 | Jain | ............... | 438/305 |
| 2006/0121680 A1 * | 6/2006 | Tanaka | .......... | 438/301 |
| 2006/0228897 A1 * | 10/2006 | Timans | .......... | 438/758 |
| 2008/0273867 A1 * | 11/2008 | Camm et al. | ......... | 392/416 |

* cited by examiner

*Primary Examiner*—Caridad M Everhart
(74) *Attorney, Agent, or Firm*—Slater & Matsil, L.L.P.

(57) ABSTRACT

A method of forming an integrated circuit is provided. The method includes performing a multiple-time flash anneal process to a wafer, wherein the multiple-time flash anneal process comprises preheating the wafer to a first preheat temperature; performing a first flash on the wafer with a first flash energy; preheating the wafer to a second preheat temperature; and performing a second flash on the wafer with a second flash energy.

22 Claims, 4 Drawing Sheets

MULTIPLE-TIME FLASH ANNEAL PROCESS

TECHNICAL FIELD

This invention relates generally to integrated circuit fabrication processes, and more particularly to the annealing of semiconductor devices.

BACKGROUND

In typical integrated circuit fabrication processes, heavily doped source and drain regions and lightly doped source and drain regions of metal-oxide-semiconductor devices are often formed by implanting dopants into desired regions. Conventionally, rapid thermal annealing (RTA) is used to activate the implanted ions of the dopants. The RTA technique typically includes quickly raising the temperature of a wafer and holding it at a high temperature for a time long enough to successfully perform the desired annealing.

When used for dopant activation, RTA requires exquisite control of wafer temperature because the high thermal activation energy required for the electrical activation of the dopants also adversely causes the diffusion of dopants. Advanced methods such as spike annealing, which has a high temperature-ramp rate, are thus used to shorten the duration of heating and cooling, hence minimizing the dwell time at peak temperature to nominally zero. In typical spike annealing, temperature is quickly ramped up to a high temperature. Without holding at the high temperature, the temperature of the wafer is immediately ramped down.

To satisfy the demands for forming increasingly smaller semiconductor devices, new processing and manufacturing techniques need to be developed in order to further reduce the diffusion of dopants. Accordingly, an important requirement for the new techniques is to reduce the amount of time that a semiconductor wafer is exposed to high temperatures during the activation. Flash anneal was thus introduced. In typical flash anneals, the wafers are exposed to the energy radiated by a flash lamp for a very short time, for example, several milliseconds. This significantly reduces the diffusion of dopants.

Flash anneals suffer drawbacks, however. Conventional flash anneals cannot reduce the sheet resistance of source and drain regions to a satisfactory level. This is because if sheet resistance is to be lowered, higher energies and higher anneal temperatures have to be provided. This will adversely cause the increase in wafer warpage due to the fact that a flash anneal process only provides energy to one side of a wafer. In addition, since the uniformity of flash anneal is related to the surface condition of the wafer, with the application of higher energies and higher anneal temperatures, the non-uniformity of sheet resistance on the wafer may be increased.

SUMMARY OF THE INVENTION

In accordance with one aspect of the present invention, a method of forming an integrated circuit includes performing a multiple-time flash anneal process to a wafer, wherein the multiple-time flash anneal process comprises preheating the wafer to a first preheat temperature; performing a first flash on the wafer with a first flash energy; preheating the wafer to a second preheat temperature; and performing a second flash on the wafer with a second flash energy.

In accordance with another aspect of the present invention, a method of forming a semiconductor device includes implanting an impurity into a portion of the semiconductor device; and performing a multiple-time anneal process to activate the impurity and to reduce the diffusion of the impurity. The multiple-time anneal process comprises radiating a first energy onto the portion of the semiconductor device with a radiation source, wherein the portion is entirely exposed to the first energy simultaneously; and radiating a second energy onto the portion of the semiconductor device with the radiation source, wherein the steps of radiating the first and the second energies each have a duration of less than about 5 milliseconds.

In accordance with yet another aspect of the present invention, a method of forming a metal-oxide-semiconductor device includes providing a semiconductor substrate; forming a shallow trench isolation (STI) region in the semiconductor substrate; forming a gate dielectric and a gate electrode on the semiconductor substrate; forming a lightly doped source/drain (LDD) region in the semiconductor substrate and adjacent the gate dielectric by a first implantation; forming a heavily doped source/drain (HDD) region in the semiconductor substrate and adjacent the gate dielectric by a second implantation; forming a silicide region on the HDD region; and performing at least one multiple-time flash anneal process after at least one of the steps of forming the STI region, the gate electrode, the LDD region, the HDD region, and the silicide region.

The advantageous features of the present invention include increased activation level of dopants, reduced sheet resistances of implanted regions, reduced warpage of wafers, and improved sheet resistance uniformities across wafers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
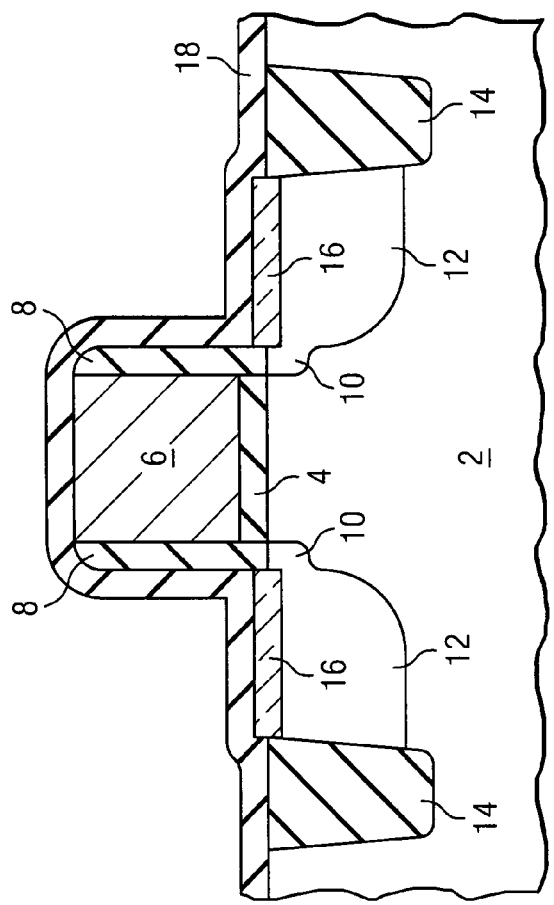
FIG. 1 illustrates a metal-oxide-semiconductor (MOS) structure.

FIG. 1 illustrates a typical metal-oxide-semiconductor (MOS) device, which includes substrate 2, gate dielectric 4, gate electrode 6 on gate dielectric 4, gate spacers 8 on sidewalls of gate electrode 6, lightly doped source/drain (LDD) regions 10, heavily doped source/drain (HDD) regions 12, and source/drain silicide regions 16.

Figure 2:
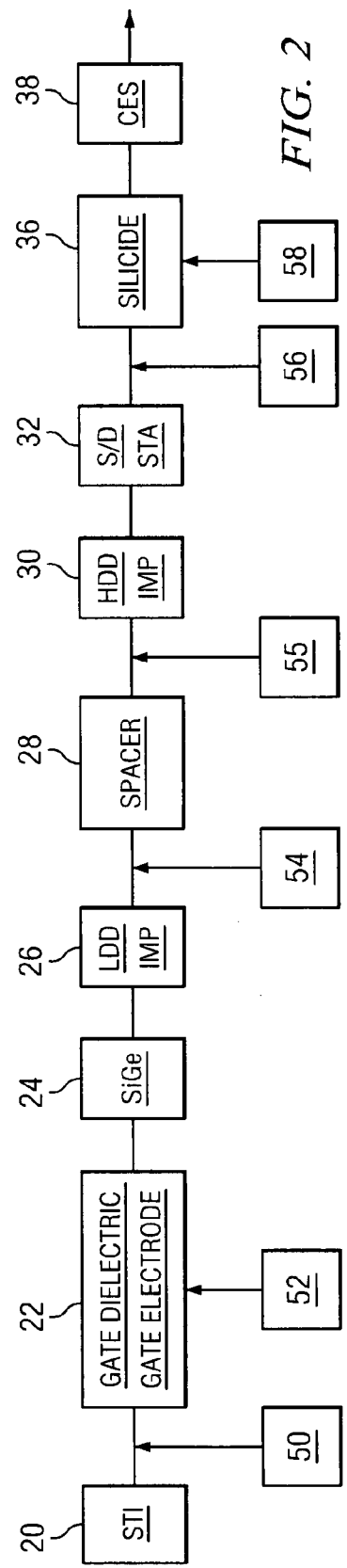
FIG. 2 illustrates a process flow for forming the MOS device shown in FIG. 1.

FIG. 2 illustrates a process flow for forming the MOS device shown in FIG. 1. The process flow in FIG. 2 is used as an example for explaining the concept of the present invention. It is to be realized, however, that the teaching provided by the present invention is readily available for the formation of other semiconductor devices.

In the formation of the MOS device shown in FIG. 1, first, shallow trench isolation (STI) regions 14 are formed in substrate 2 (step 20). Gate dielectric 4 and gate electrode 6 are then formed (step 22), preferably by forming a gate dielectric layer and a gate electrode layer, and then patterning the gate dielectric layer and the gate electrode layer. The gate electrode layer may be a polysilicon layer pre-doped with a dopant. For p-type MOS (PMOS) devices, silicon germanium (SiGe) stressors (not shown in FIG. 1) may optionally be formed (step 24). LDD regions 10 are preferably formed by implanting desired dopants (step 26). Gate spacers 8 are then formed (step 28), followed by the formation of HDD regions 12, preferably by implanting desired dopants (step 30). A rapid thermal anneal (RTA) is then performed (step 32). Optionally, a stress modulation layer (not shown in FIG. 1) may be formed, followed by an anneal to transfer the stress in the stress modulation layer into HDD regions 12. The stressed modulation layer is then removed. The stress transfer using stress modulation layer may be performed any time between the formation of gate electrode 6 and the formation of silicide regions 16. Next, silicide regions 16 are formed on HDD regions 12 and gate electrode 6 for improving contact to these regions (step 36). Contact etch stop layer 18 is formed to cover the structure formed in the preceding process steps (step 38).

In the process steps discussed in the preceding paragraph, various flash anneal steps may be performed. For example, after the formation of STI regions 14, flash anneal step 50 may be performed to anneal STI regions 14. After the formation of gate electrode 6, particularly if a pre-doping is performed to the gate electrode layer, flash anneal step 52 may be performed. Flash anneal step 54 may be performed to activate the dopants in LDD regions 10. Flash anneal step 56 may be performed to activate dopants in HDD regions 12 and dopants in gate electrode 6. Further flash anneal step 55 may be used to transfer stress in the stress modulation layer into HDD regions 12. Flash anneal step 58 may be performed for the formation of silicide. Depending on the design requirement and individual process flow, some of the flash anneal steps may either be skipped, or replaced by other annealing methods.

In an embodiment of the present invention, each of the above-discussed flash anneal steps may include more than one flash anneal, and thus the respective flash anneal step is referred to as a multiple-time flash anneal. On the other hand, a flash anneal step including only one flash anneal is referred to as a one-time flash anneal. The details of the multiple-time flash anneal are discussed in subsequent paragraphs.

Figure 3:
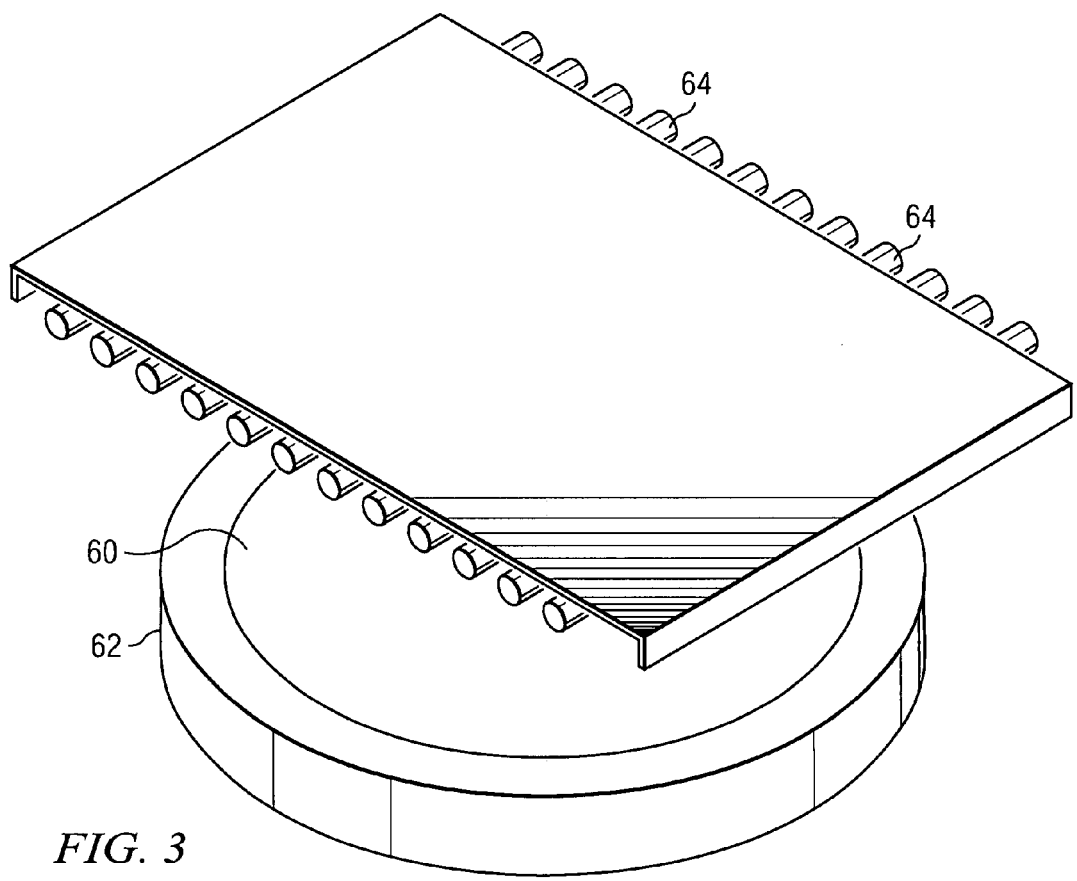
FIG. 3 illustrates an exemplary flash anneal apparatus.

FIG. 3 illustrates an exemplary flash anneal apparatus which is used for multiple-time flash anneals and one-time flash anneals. Wafer 60 is placed on hot plate 62, which is for preheating wafer 60 to a first preheat temperature, for example, between about 400° C. and about 600° C. Flash lamp 64 is placed over wafer 60. Flash lamp 64 is capable of being charged to store a pre-determined level of energy, for example, between about 15 Joules and about 40 Joules, and releasing (flashing) the energy in a very short duration, such as less than about 5 milliseconds, and preferably between about 0.3 milliseconds and 5 milliseconds. Accordingly, the temperature of wafer 60 is quickly raised to a high temperature, for example, as high as 1300° C. A one-time flash anneal thus may include the process of preheating wafer 60, charging the flash lamp 64, and flashing the flash lamp.

In a multiple-time flash anneal, in addition to the first preheating and the first flash, wafer 60 is preheated to a second preheat temperature, and a second flash is performed to anneal wafer 60 a second time. Preferably, no other process steps unrelated with flash anneals, such as forming or removing features from wafer 60, are inserted between the first and the second flashes. Since the temperature of wafer 60 is high due to the first flash, wafer 60 may need to be cooled down, and preheated to the second preheat temperature before the second flash is performed. The cooling of wafer 60 may be performed in a separate chamber or in a same chamber as where the first flash was performed.

Each of the multiple-time flash anneals may further include more flashes, and each flash may have a different preheat temperature and/or a different energy from the other flashes. For example, different combinations of high preheat temperatures, low preheat temperatures, high flash energies, and low flash energies and the like may be used for the flashes in a multiple-time flash anneal. Preferably, the preheat temperature and flash energy of each of the flashes are in similar ranges as that of a one-time flash anneal. Being able to perform flashes with different combinations of preheat temperatures and flash energies, the multiple-time flash process provides flexibilities for achieving customized effects. It is appreciated that higher activation rates may be achieved by higher flash energies and/or higher preheat temperatures. However, a higher flash energy causes wafer 60 to have a greater degree of warpage due to the fact that flash anneals only heat the topside of wafer 60. Conversely, a high preheat temperature is capable of heating both sides of wafer 60, and hence incurring less warpage. However, the diffusion of dopants may be increased if high preheat temperatures are adopted. The preheat temperatures and flash energies thus need to be balanced depending on design requirements. In an exemplary multiple-time flash anneal 56, which is for activating HDD regions and gate electrodes, the first anneal has a low preheat temperature and a low energy, and the second anneal has a high preheat temperature and a high energy. In an exemplary embodiment, each of the first and the second flashes has a preheat temperature of between about 200° C. and about 600° C., and a flash energy of between about 15 Joules and about 40 Joules.

Advantageously, multiple flashes provide more choices for customizing the flash anneals. It is appreciated, however, that the preferred preheat temperature and flash energy is related to the specific process step, and even to the sizes of the wafers. In an exemplary embodiment, the flash anneal steps for activating dopants, such as flash anneal steps 52, 54 and 56 (refer to FIG. 2), are multiple-time flash anneals, while other flash anneal steps, such as anneal steps 50 and 58, may be either one-time anneals or multiple-time flash anneals. In other embodiments, experiments may be performed to determine the effects of multiple-time anneal in each of the flash anneal steps 50, 52, 54, 56 and 58, so that an optimal number of flashes in each of the multiple-time flash anneal may be determined.

Figure 4:
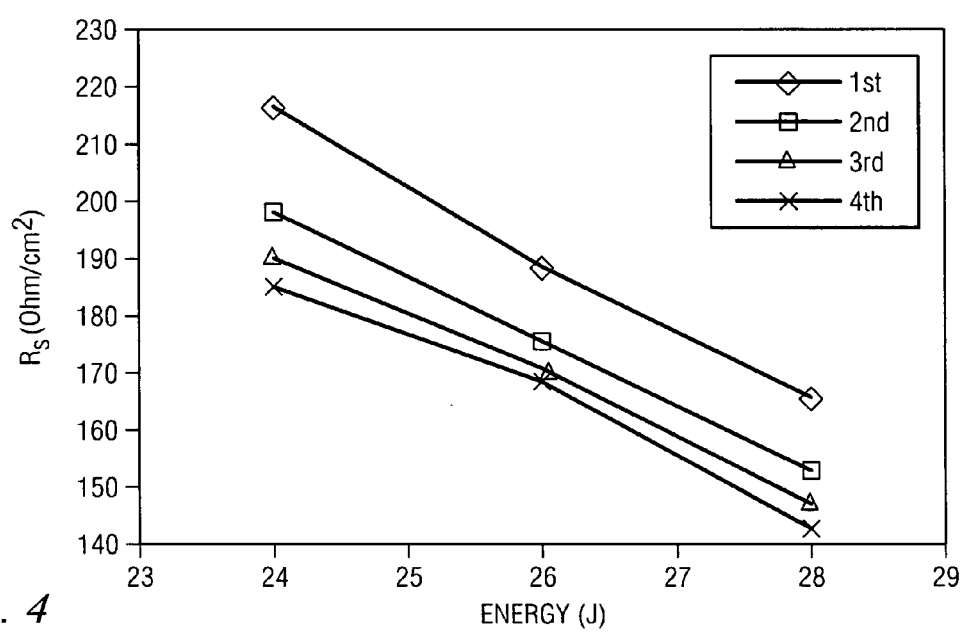
FIG. 4 illustrates sheet resistances in implanted regions as a function of energies of flash anneals, wherein the sheet resistances are reduced with an increase in the number of flashes.

FIG. 4 illustrates experiment results of multiple-time flash anneals, wherein HDD regions of sample MOS devices shown in FIG. 1 are used as samples. The X-axis represents the flash energies, and the Y-axis represents the sheet resistance Rs of the resulting HDD regions. It is observed that for each of the given flash energies 24, 26 and 28 Joules, each additional flash causes an additional decrease in the sheet resistances. Therefore, multiple-time flash anneals are advantageous over one-time flash anneals in the reduction of sheet resistance in implanted regions. It is clear from FIG. 4 that higher flash energies are more effective in reducing sheet resistance, although higher flash energies will cause greater degree of warpages. It is also found that when the number of flashes increases, the additional reduction of sheet resistances Rs becomes increasingly smaller, indicating the sheet resistances will decrease to certain saturated levels after a certain number of flashes. Therefore, an optimum number of flashes in a multiple-time flash anneal may be determined.

Figure 5:
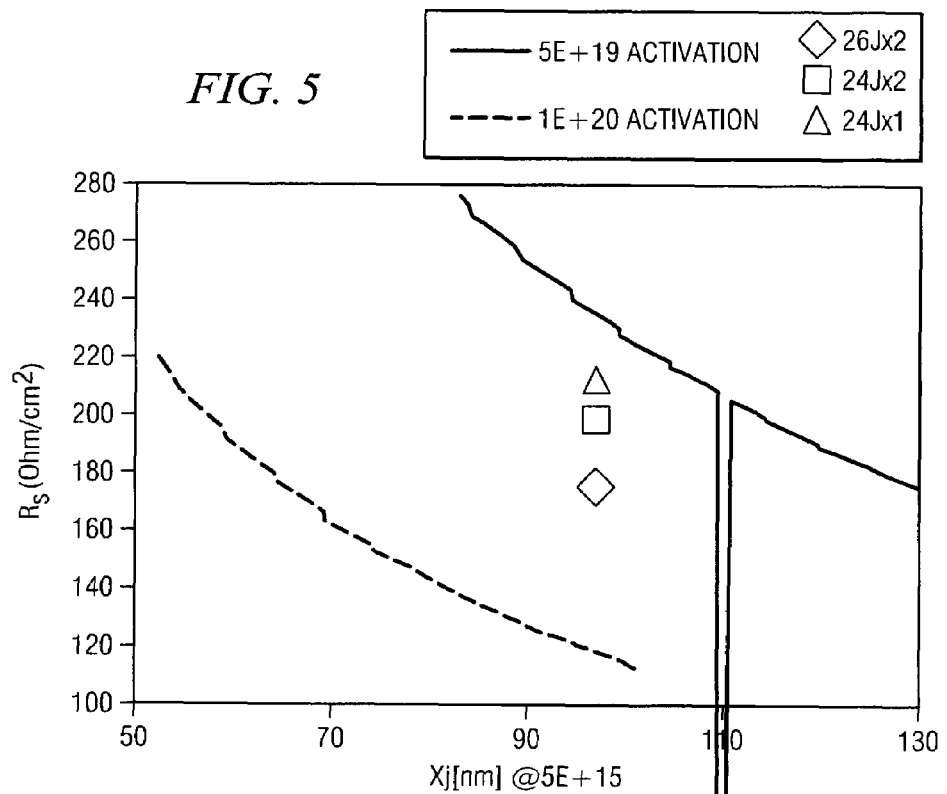
FIG. 5 illustrates sheet resistances of implanted regions as a function of junction depths.
Figure 6:
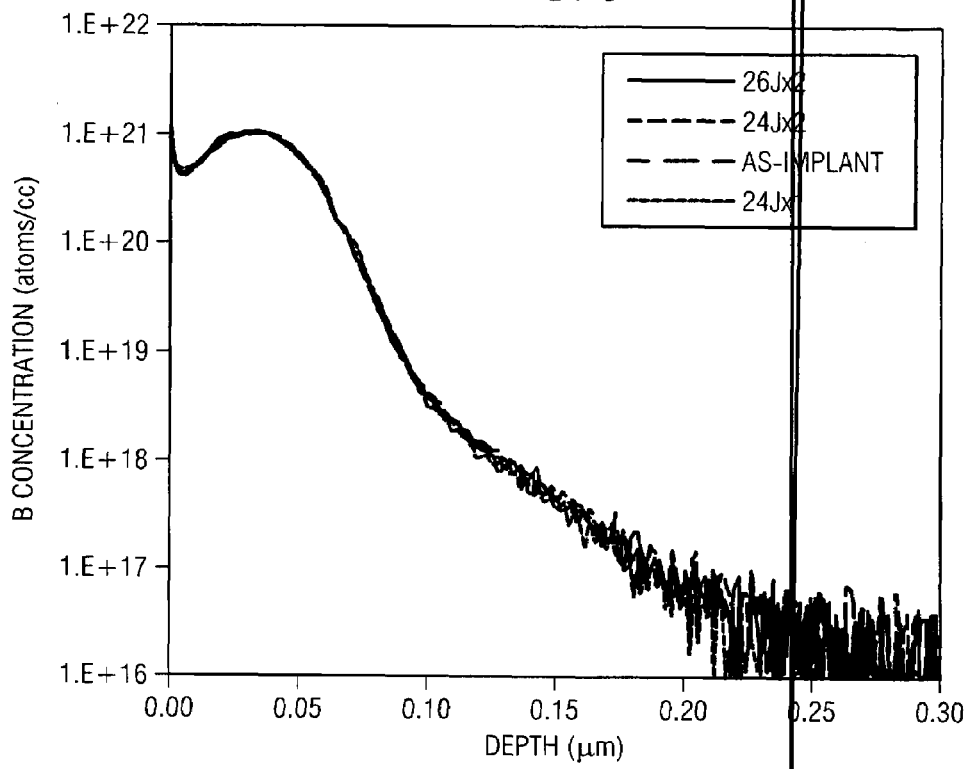
FIG. 6 illustrates boron concentrations in implanted regions as a function of depths.

FIG. 5 illustrates sheet resistances Rs as a function of junction depth. It is observed that the activation level for two-times flash anneals are higher than the activation level for one-time flash anneals, further proving the advantageous features of multi-time flash anneals Compared to one one-time flash anneals, the additional diffusion and warpage caused by additional flashes in multiple-time flash anneals are not noticeably increased. FIG. 6 illustrates the distribution of boron concentration in the HDD regions as a function of diffusion depths. Four distributions are shown, corresponding to as-implanted boron distribution (marked as "as-implant"), the boron distribution after one flash with a flash energy of 24 Joules (marked as "24J×1"), the boron distribution after two flashes each with flash energies of 24 Joules (marked as "24J×2") and the boron distribution after two flashes each with flash energies of 26 Joules (marked as "26J×2"). It is noted that four distributions substantially overlap, indicating the one-time flash anneals and multiple-time flash anneals do not incur noticeable increases in dopant diffusion depths.

Figure 7:
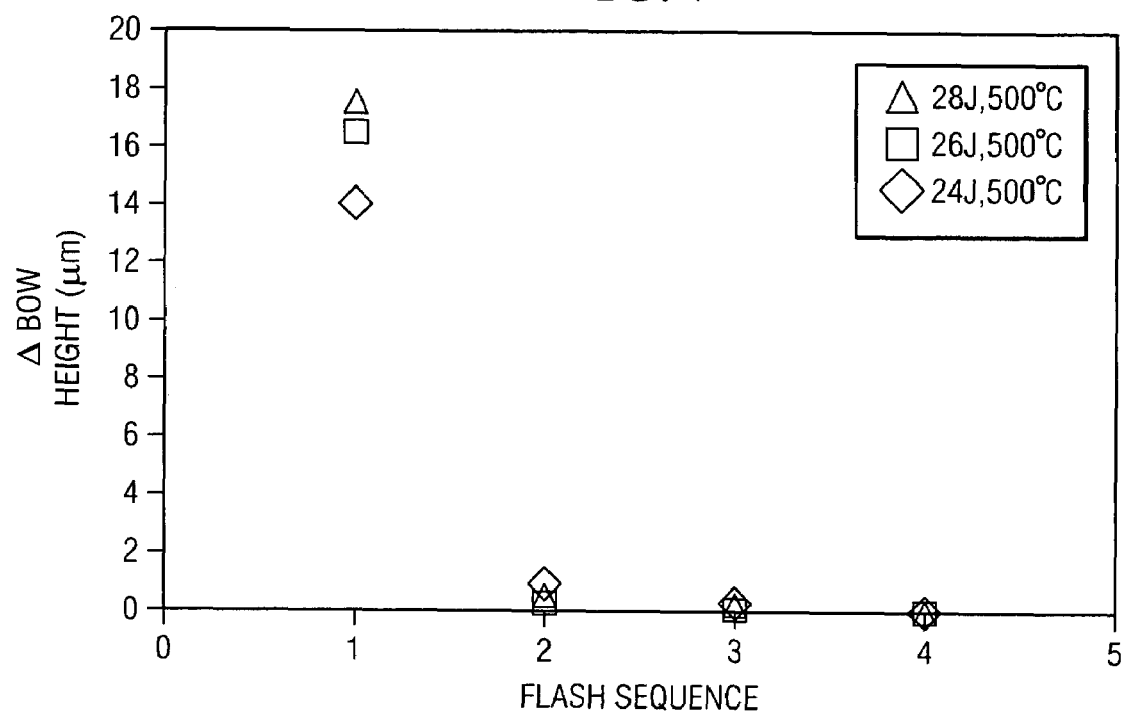
FIG. 7 illustrates the relationship between the increases in bow heights of a wafer and the number of flashes.

The warpages of the multiple-time flash anneal are shown in FIG. 7, wherein the Y-axis shows the bow height increase caused by each flash, wherein bow height is the distance the edges of a wafer shift from the plane of the center of the wafer. The X-axis indicates the flash sequences. Three multiple-time flash anneals are performed with the preheat temperatures of 500° C., and the first the second and the third multiple-time flash anneals have the flash energies of 24, 26 and 28 Joules, respectively. It is noted that the warpages are dominated by the first flashes, while each of the additional flashes in each of the multiple-time flash anneals causes substantially no increase in the bow height. Therefore, multiple-time flash anneals introduce substantially no additional warpage over one-time flash anneals.

Further advantageous features of the multiple-time flash anneals include more uniform distribution of sheet resistances Rs throughout a wafer. Experiment results have shown that with one-time flash anneals, the standard deviation of sheet resistances Rs across a wafer is about 2.52%, while with multiple-time flash anneals, the standard deviation of sheet resistance Rs is reduced to about 1.91%. This may be related to the saturation in the reduction of Rs when multiple flashes are performed (refer to FIG. 4). Furthermore, with multiple-time flash anneals, defects in HDD regions may be recovered more than one-time flash anneals.

Although the embodiments discussed in the preceding paragraphs uses flash anneals as an example, the concept of the present invention may be applied to other anneal methods using radiation sources to radiate energy in very short durations, which may be close to, or even shorter than the duration of flash anneals.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:
performing a multiple-time flash anneal process to a wafer, wherein the multiple-time flash anneal process comprises:
preheating the wafer to a first preheat temperature;
performing a first flash on the wafer with a first flash energy;
preheating the wafer to a second preheat temperature; and
performing a second flash on the wafer with a second flash energy different from the first flash energy.

2. The method of claim 1 further comprising:
preheating the wafer to a third preheat temperature; and
performing a third flash on the wafer with a third flash energy.

3. The method of claim 1, wherein the first preheat temperature is different from the second preheat temperature.

4. The method of claim 1, wherein the first and second preheat temperatures are the same.

5. The method of claim 1, wherein the first and the second flashes each have a duration of less than about 5 milliseconds, and wherein the first and the second preheat temperatures each are between about 200° C. and about 600° C.

6. The method of claim 1 further comprises cooling the wafer between the steps of performing the first flash and preheating the wafer to the second preheat temperature.

7. The method of claim 1, wherein no additional implanting step is performed between the step of performing the first flash and the step of performing the second flash.

8. The method of claim 1, wherein no additional feature is formed or removed between the step of performing the first flash and the step of performing the second flash.

9. The method of claim 1, wherein no additional step is performed between the step of performing the first flash and the step of performing the second flash, wherein the additional step is selected from the group consisting essentially of forming a shallow trench isolation (STI) region in the wafer, forming a gate electrode over the wafer, and forming a lightly-doped source/drain (LDD) region in the wafer.

10. The method of claim 1, wherein the multiple-time flash anneal process is performed on an implanted region for activating dopants in the implanted region.

11. The method of claim 10, wherein the multiple-time flash anneal process is performed to exposed regions selected from the group consisting essentially of lightly doped source/drain regions of metal-oxide-semiconductor devices, heavily doped source/drain regions of the metal-oxide-semiconductor devices, and combinations thereof.

12. A method of forming a semiconductor device, the method comprising:

providing a wafer comprising the semiconductor device;
implanting an impurity into a portion of the semiconductor device to form a heavily doped source/drain region of a metal-oxide-semiconductor device;
before the step of implanting the impurity, performing a multiple-time flash anneal process to activate the impurity and to reduce a diffusion of the impurity, wherein the multiple-time flash anneal process comprises:
 radiating a first energy onto the portion of the semiconductor device with a radiation source; and
 radiating a second energy onto the portion of the semiconductor device with the radiation source, wherein the steps of the radiating the first and the second energies each have a duration of less than about 5 milliseconds.

13. The method of claim 12, wherein the radiation source is a flash lamp.

14. The method of claim 12, wherein no additional components are formed on or removed from the semiconductor device between the steps of radiating the first and the second energies.

15. The method of claim 12, wherein no process steps re-related to flash anneals are inserted between the step of radiating the first energy and the step of radiating the second energy.

16. The method of claim 12 further comprising preheating the semiconductor device to a first preheat temperature before the step of radiating the first energy, and preheating the semiconductor device to a second preheat temperature before the step of radiating the second energy.

17. The method of claim 16 further comprising a cooling process between the steps of radiating the first energy and preheating the semiconductor device to the second preheat temperature.

18. A method of forming a metal-oxide-semiconductor device, the method comprising;
 providing a semiconductor substrate;
 forming a shallow trench isolation (STI) region in the semiconductor substrate;
 forming a gate dielectric and a gate electrode on the semiconductor substrate;
 forming a lightly doped source/drain (LDD) region in the semiconductor substrate and adjacent the gate dielectric by a first implantation;
 forming a heavily doped source/drain (HDD) region in the semiconductor substrate and adjacent the gate dielectric by a second implantation;
 forming a silicide region on the HDD region; and
 performing a multiple-time flash anneal process between two consecutive ones in a group of steps comprising the step of forming the STI region, the step of forming the gate electrode, the step of forming the LDD region, and the step of forming the HDD region.

19. The method of claim 18, wherein the multiple-time flash anneal process is performed only after the steps of forming the LDD region and before the step of forming the HDD region.

20. The method of claim 18, wherein the multiple-time flash anneal process is performed after the step of forming the gate electrode and before the step of forming the LDD region.

21. The method of claim 18, wherein the multiple-time flash anneal process comprises:
 preheating the semiconductor substrate to a first preheat temperature;
 performing a first flash to the semiconductor substrate with a first flash energy;
 cooling the semiconductor substrate to a temperature lower than a second preheat temperature;
 preheating the semiconductor substrate to the second preheat temperature; and
 performing a second flash to the semiconductor substrate with a second flash energy.

22. The method of claim 18, wherein the multiple-time flash anneal process is performed after the step of forming the STI region and before the step of forming the gate electrode.

* * * * *